United States Patent
Lee

[11] Patent Number: 5,854,769
[45] Date of Patent: Dec. 29, 1998

[54] ADDRESS INPUT BUFFER WITH SIGNAL CONVERTER

[75] Inventor: Jae Jin Lee, Kyoungki-do, Rep. of Korea

[73] Assignee: Hyundai Electronics Industries Co., Ltd., Ichon-shi, Rep. of Korea

[21] Appl. No.: 944,708

[22] Filed: Oct. 6, 1997

Related U.S. Application Data

[63] Continuation of Ser. No. 524,999, Sep. 8, 1995, abandoned.

[30] Foreign Application Priority Data

Sep. 9, 1994 [KR] Rep. of Korea ............... 1994 22727

[51] Int. Cl.[6] ............................................. G11C 8/00
[52] U.S. Cl. ............................ 365/230.02; 365/230.08
[58] Field of Search ........................... 365/230.02, 230.08

[56] References Cited

U.S. PATENT DOCUMENTS

| | | | |
|---|---|---|---|
| 3,798,617 | 3/1974 | Varadi et al. | 365/230.03 |
| 4,811,303 | 3/1989 | Hirai | 365/230.08 |
| 4,985,867 | 1/1991 | Ishii et al. | 365/230.08 |
| 5,237,536 | 8/1993 | Ohtsuki | 365/230.08 |
| 5,260,903 | 11/1993 | Suyama et al. | 365/230.08 |
| 5,305,282 | 4/1994 | Choi | 365/230.08 |
| 5,327,389 | 7/1994 | Seok et al. | 365/230.02 |
| 5,568,432 | 10/1996 | Wada | 365/200 |
| 5,689,457 | 11/1997 | Shimohigashi et al. | 365/149 |
| 5,691,953 | 11/1997 | Yeh et al. | 365/230.08 |

*Primary Examiner*—David Nelms
*Assistant Examiner*—Michael T. Tran
*Attorney, Agent, or Firm*—Thelen Reid & Priest

[57] ABSTRACT

An address input buffer for a semiconductor memory device comprising an address buffering circuit fox buffering at least two external address signals A1 and A2, at least two output terminals for outputting the external address signals A1 and A2 buffered by the address buffering circuit as internal address signals AI_1 and AI_2, respectively, a multiplexing circuit connected between the address buffering circuit and the output terminals, for selectively transferring the external address signals A1 and A2 buffered by the address buffering circuit to the output terminals, and a multiplexing control circuit for controlling the multiplexing circuit. According to the present invention, the address input buffer for the semiconductor memory device can convert the external address signals in such a manner that memory cells in the memory device can fairly be accessed.

8 Claims, 6 Drawing Sheets

ADDRESS INPUT BUFFER WITH SIGNAL CONVERTER

This is a continuation of application Ser. No. 08/524.999, filed on Sep. 8, 1995 now abandoned.

BACKGROUND OF THE INVENTION

1. Field of the Invention

The present invention relates in general to address input buffers for semiconductor memory devices such as a dynamic random access memory (DRAM), a static random access memory (SRAM) and a read only memory (ROM), and more particularly to an address input buffer for a semiconductor memory device which is capable of converting address signals in such a manner that memory cells in the memory device can fairly be accessed.

2. Description of the Prior Art

Referring to FIG. 1, a conventional memory cell array is shown centering around addresses. First, external address signals are generated to operate the memory cell array. In one operation, in the case where the generated address signals designate memory cells beginning with the lowest address, memory cells in a region AA may all be used, whereas memory cells in a region BB may be used or not. For example, when data are stored into memory cells of lower addresses, the memory cells in the region BB are not used and remain empty. In the subsequent operation, similarly, it the generated address signals designate the memory cells beginning with the lowest address, the memory cells in the region AA may all be used, whereas the memory cells in the region BB may be used or not. With the above operations repeated, the memory cells in the region AA are more frequently accessed than those in the region BB. As a result, transistors constituting the memory cells in the region AA are subjected to damage. Namely, in each of the memory cells in the region AA, a threshold voltage $V_T$ or a transconductance is varied in response to electrons being accumulated on a gate oxide. The above operations may be an exception in a refresh mode of a DRAM, but related to a column address buffer.

FIGS. 2 and 3 are block diagrams showing conventional address input buffers. Internal address signals Aint and /Aint are generated in response to an external address signal Add. In the case where the external address signal Add is constant, the internal address signals Aint and /Aint are also constant.

FIG. 4 is a block diagram showing a conventional address input buffer for performing ×1/×4 operations, which may be applied to a 4M DRAM. A pin is recognized as No. 9 in the ×4 operation and as No. 10 in the ×1 operation.

AS shown in FIGS. 2 to 4, each of the conventional address input buffers performs a predetermined function in a memory device in response to the input address signal to the specified address pin.

In the memory device, there may be present two address signals with different functions. One of the two address signals may have a least significant bit (LSS) for enabling high-speed and low-power functions. But, an external environment may have a different implementation from that of the memory device. In other words, the circuitry of the memory device may be operated in response to the LSB of the address signal, whereas the external environment may be operated in response to a most significant bit (MSB) of the address signal. In this case, the memory device cannot perform its function fully. Further, in response to the external address signal, some memory cells may frequently be accessed, whereas other memory cells may rarely be accessed.

SUMMARY OF THE INVENTION

Therefore, the present invention has been made in view of the above problems, and it is an object of the present invention to provide an address input buffer for a semiconductor memory device which is capable of fairly accessing memory cells in the memory device.

In accordance with the present invention, the above and other objects can be accomplished by providing an address input buffer for a semiconductor memory device comprising address buffering means for buffering at least two external address signals A1 and A2; at least two output terminals for outputting the external address signals A1 and A2 buffered by the address buffering means as internal address signals AI_1 and AI_2, respectively; multiplexing means connected between the address buffering means and the output terminals, for selectively transferring the external address signals A1 and A2 buffered by the address buffering means to the output terminals; and multiplexing control means for controlling the multiplexing means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

First, the principle of the present invention will hereinafter be mentioned for the convenience of description.

An address input buffer of the present invention converts external address signals in a memory device in such a manner that memory cells in the memory device can fairly be accessed. In other words, the address input buffer converts the input order of the external address signals in the memory device. For example, in the case where the external address signals are applied beginning with the highest order, they are converted in the memory device to be applied beginning with the lowest order.

The conversion of the address input order may be performed by reversing the input order of address bits or changing the address bits from high to low in logic and vice versa. The present invention can be classified into the address bit order conversion and the address polarity conversion.

Assume that A2, A1 and A0 correspond to three binary digits expressing an octal number, respectively. Converting octal numbers 0, 1, 2, 3, 4, 5, 6 and 7 into binary numbers, the result is;

000, 001, 010, 011, 100, 101, 110 and 111

Changing the binary digits A2 and A0 with each other, the result is:

000, 100, 010, 110, 001, 101, 011 and 111

These binary numbers are converted into octal numbers as follows:

0, 4, 2, 6, 1, 5, 3 and 7

Inverting the binary digit A2 in polarity, the result is:

4, 5, 6, 7, 0, 1, 2 and 3

For example, in a test mode. lower-order bits A0 and A1 of the external address signal may be required in the memory device, whereas higher-order bits A9 and A8 thereof may be required in the outside of the memory device. In this case, the higher-order bits A9 and A8 of the external address signal must be converted into the lower-order bits A0 and A1 in the memory device. To this end, the address input buffer must comprise an address converter.

Figure 1:
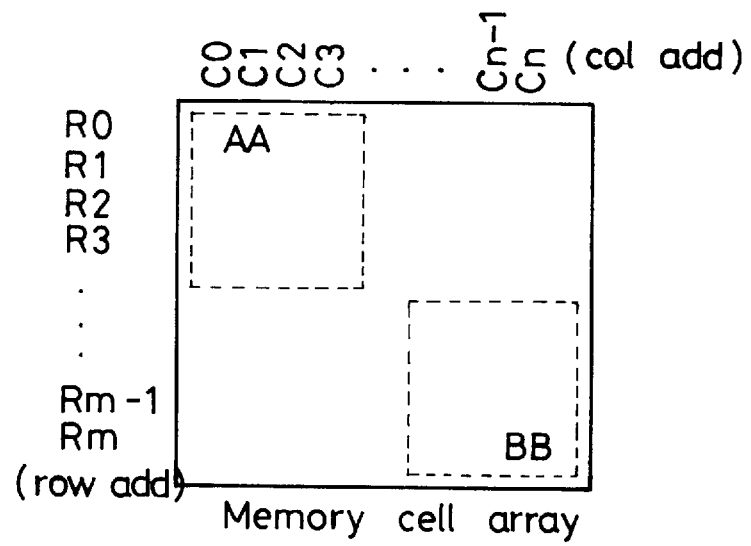
FIG. 1 is a view illustrating a conventional memory cell array.
Figure 2:
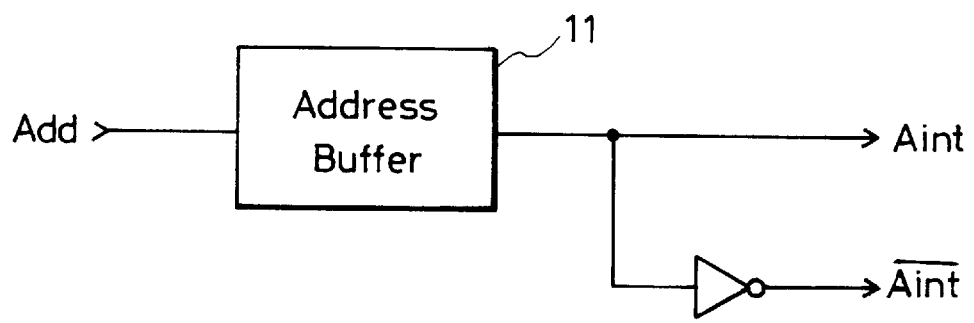
FIGS. 2 to 4 are block diagrams illustrating conventional address input buffers.
Figure 3:
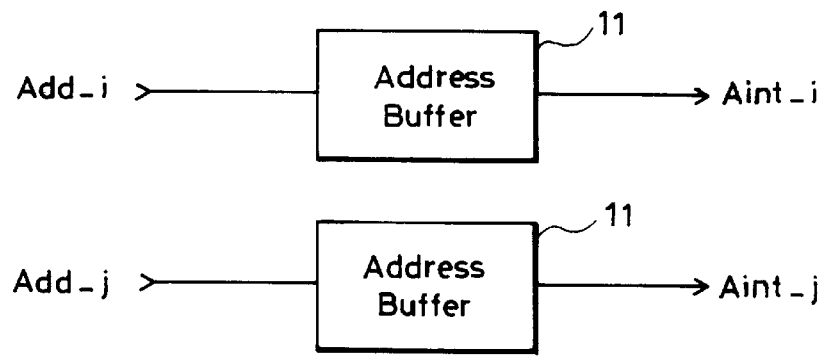
Figure 4:
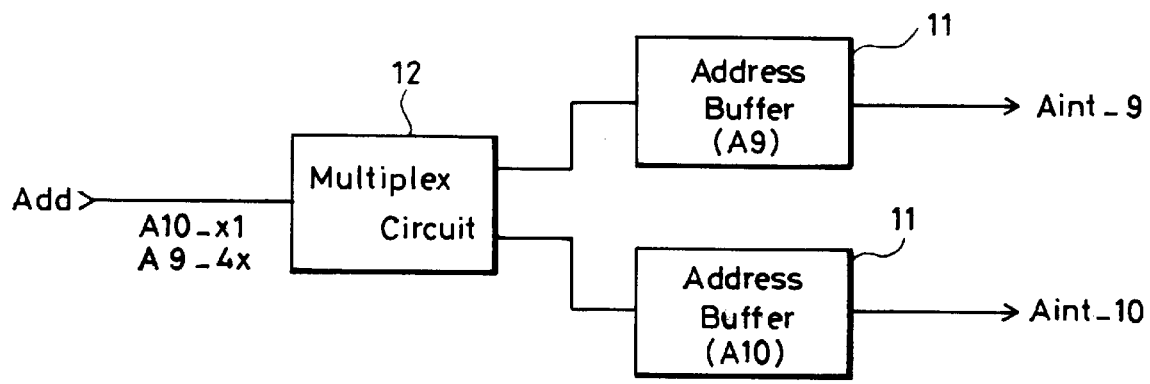
Figure 5:
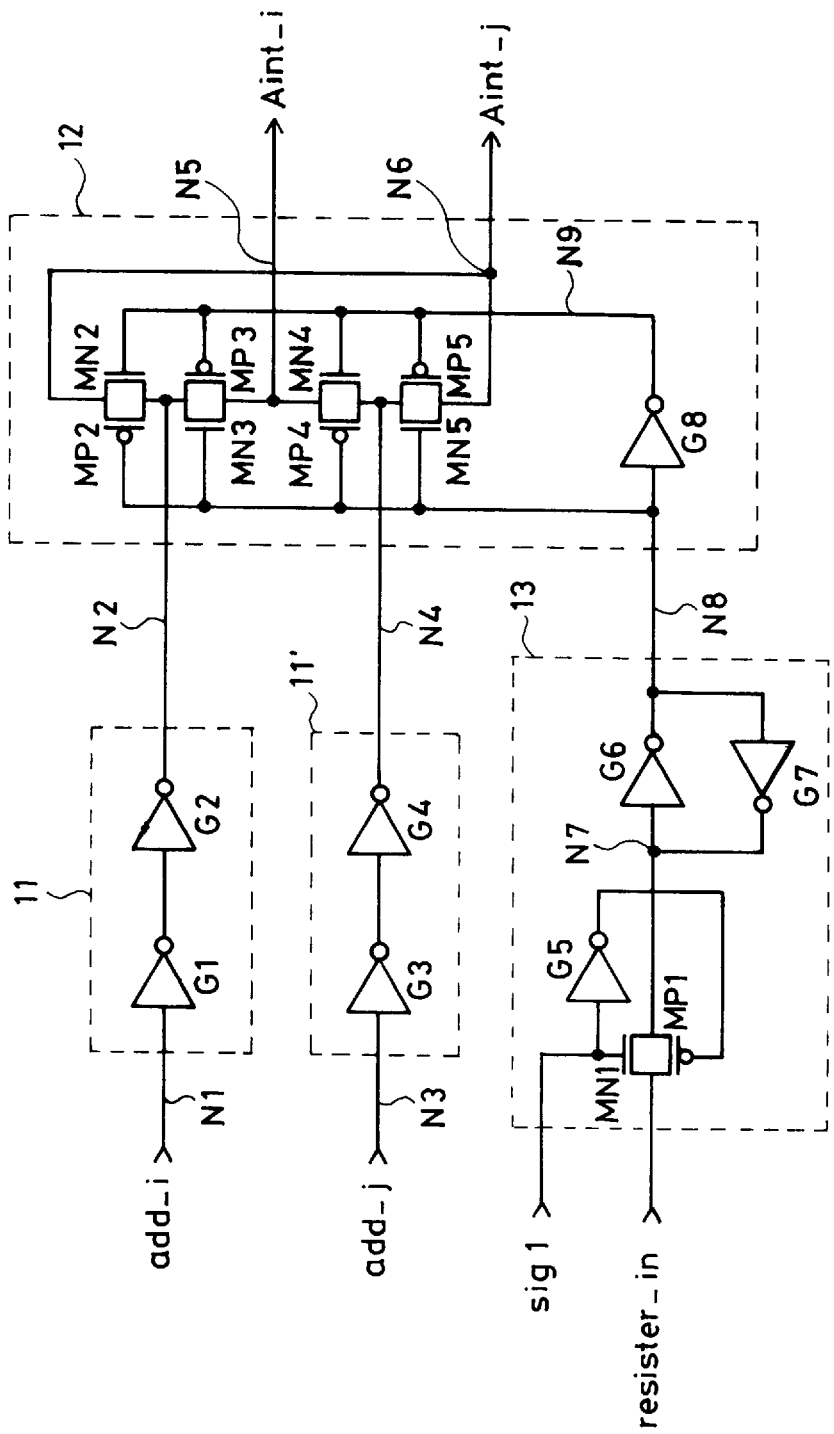
FIG. 5 is a circuit diagram of an address input buffer in accordance with a first embodiment of the present invention.

Referring to FIG. 5, there is shown a circuit diagram of an address input buffer in accordance with a first embodiment of the present invention. As shown in this drawing, the address input buffer comprises an address buffering circuit 11 for buffering an is external address signal Add__i. To this end, the address buffering circuit 11 includes two inverters G1 and G2 connected in series between an input node N1 for inputting the external address signal Add__i and a node N2.

The address input buffer further comprises an address buffering circuit 11' for buffering an external address signal Add__j. To this end, the address buffering circuit 11' includes two inverters G3 and G4 connected in series between an input node N3 for inputting the external address signal Add__j and a node N4.

The address input buffer further comprises a multiplexing circuit control signal generator 13 including transfer transistors MN1 and MP1 for transferring an input signal register__in to a node N7 in response to a control signal sig1, an inverter G5 for inverting the control signal sig1 being applied to a gate of the transfer transistor MN1 and applying the inverted control signal to a gate of the transfer transistor MP1, and inverters G6 and G7 connected in parallel between the node N7 and a node N8.

The address input buffer further comprises a multiplexing circuit 12 including an inverter G8 connected between the node N8 and a node N9, transfer transistors MP2 and MN2 connected between the node N2 and a node N6, transfer transistors MP3 and MN3 connected between the node N2 and a node N5, transfer transistors MP4 and MN4 connected between the nodes N4 and N5, and transfer transistors MP5 and MN5 connected between the nodes N4 and N6. The transfer transistors MP2, MN3, MP4 and MN5 are operated in response to a signal on the node N8. The transfer transistors MN2, MP3, MN4 and MP5 are operated in response to a signal on the node N9.

The operation of the address input buffer with the above-mentioned construction in accordance with the first embodiment of the present invention will hereinafter be described in detail.

If the signal on the node N8 which is a control signal to the multiplexing circuit 12 is high in level, the transfer transistors MN3, MP3, MN5 and MP5 in the multiplexing circuit 12 are turned on. As a result, the external address signals Add__i and Add__j are outputted as internal address signals Aint__i and Aint__j, respectively. on the contrary, if the signal on the node N8 is low in level, the transfer transistors MN2, MP2, MN4 and MP4 in the multiplexing circuit 12 are turned on. As a result, the external address signals Add__i and Add__j are outputted as the internal address signals Aint__j and Aint__i, respectively.

Figure 6:
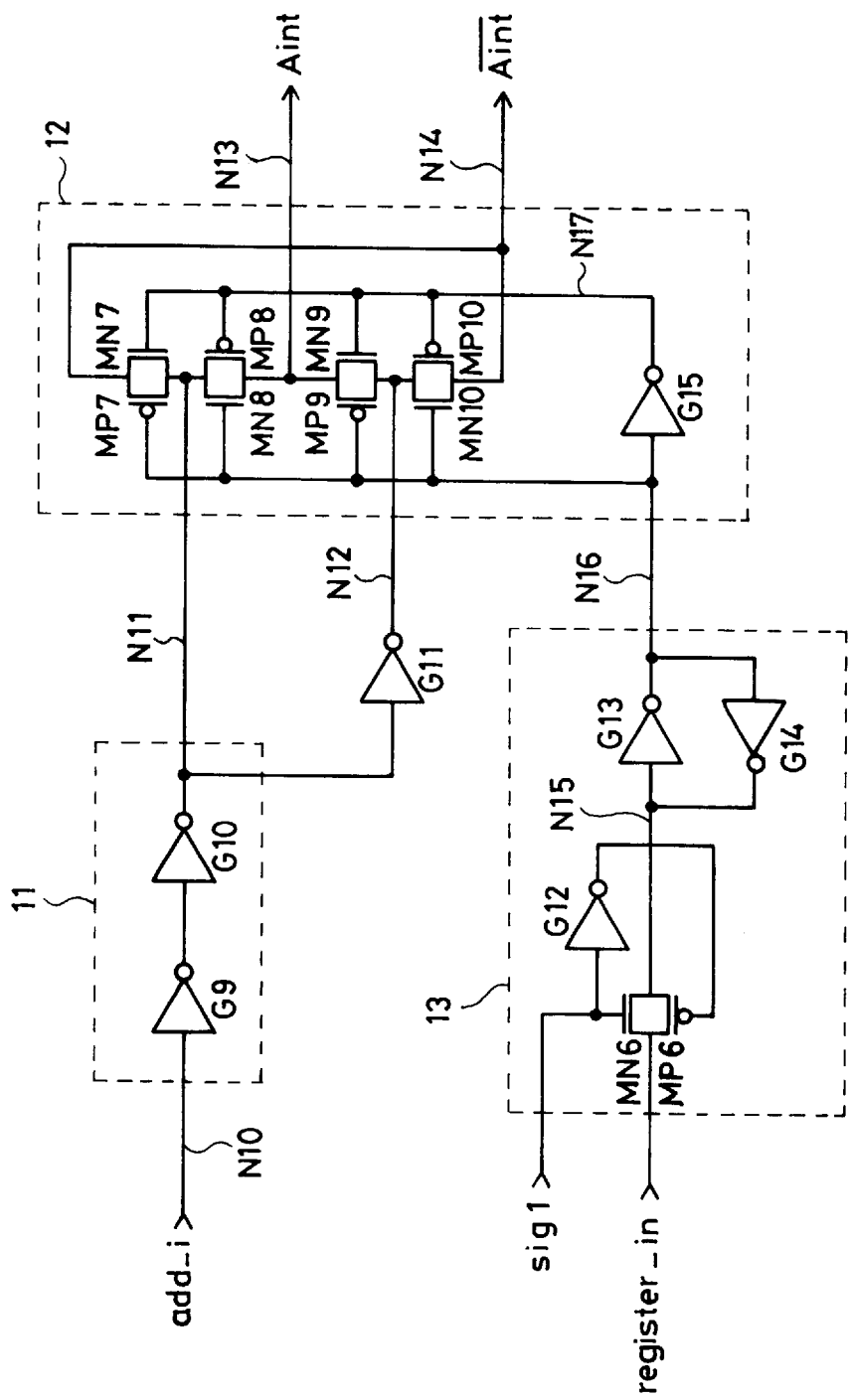
FIG. 6 is a circuit diagram of an address input buffer in accordance with a second embodiment of the present invention.

Referring to FIG. 6, there is shown a circuit diagram of an address input buffer in accordance with a second embodiment of the present invention. As shown in this drawing, the address input buffer comprises an address buffering circuit 11 for buffering an external address signal Add__i. To this end, the address buffering circuit 11 includes two inverters G9 and G10 connected in series between an input node N10 for inputting the external address signal Add__i and a node N11.

The address input buffer further comprises an inverter G11 connected between the node N11 and a node N12, and a multiplexing circuit control signal generator 13 including transfer transistors MN6 and MP6 for transferring an input signal register__in to a node N15 in response to a control signal sig1, an inverter G12 for inverting the control signal sig1 being applied to a gate of the transfer transistor MN6 and applying the inverted control signal to a gate of the transfer transistor MP6, and inverters G13 and G14 connected in parallel between the node N15 and a node N16.

The address input buffer further comprises a multiplexing circuit 12 including an inverter G15 connected between the node N16 and a node N17, transfer transistors MP7 and MN7 connected between the node N11 and a node N14, transfer transistors MP8 and MN8 connected between the node N11 and a node N13, transfer transistors MP9 and MN9 connected between the nodes N12 and N13, and transfer transistors MP10 and MN10 connected between the nodes N12 and N14. The transfer transistors MP7, MN8, MP9 and MN10 are operated in response to a signal on the node N16. The transfer transistors MN7, MP8, MN9 and MP10 are operated in response to a signal on the node N17.

The operation of the address input buffer with the above-mentioned construction in accordance with the second embodiment of the present invention will hereinafter be described in detail.

If the signal on the node N16 which is a control signal to the multiplexing circuit 12 is high in level, the transfer transistors MN8, MP8, MN10 and MP10 in the multiplexing circuit 12 are turned on. As a result, the external address signals Add__i and /Add__i are outputted as internal address signals Aint and /Aint, respectively. On the contrary, if the signal on the node N16 is low in level, the transfer transistors MN7, MP7, MN9 and DP9 in the multiplexing circuit 12 are turned on. As a result, the external address signals Add__i and /Add__i are outputted as the internal address signals /Aint and Aint, respectively.

Figure 7:
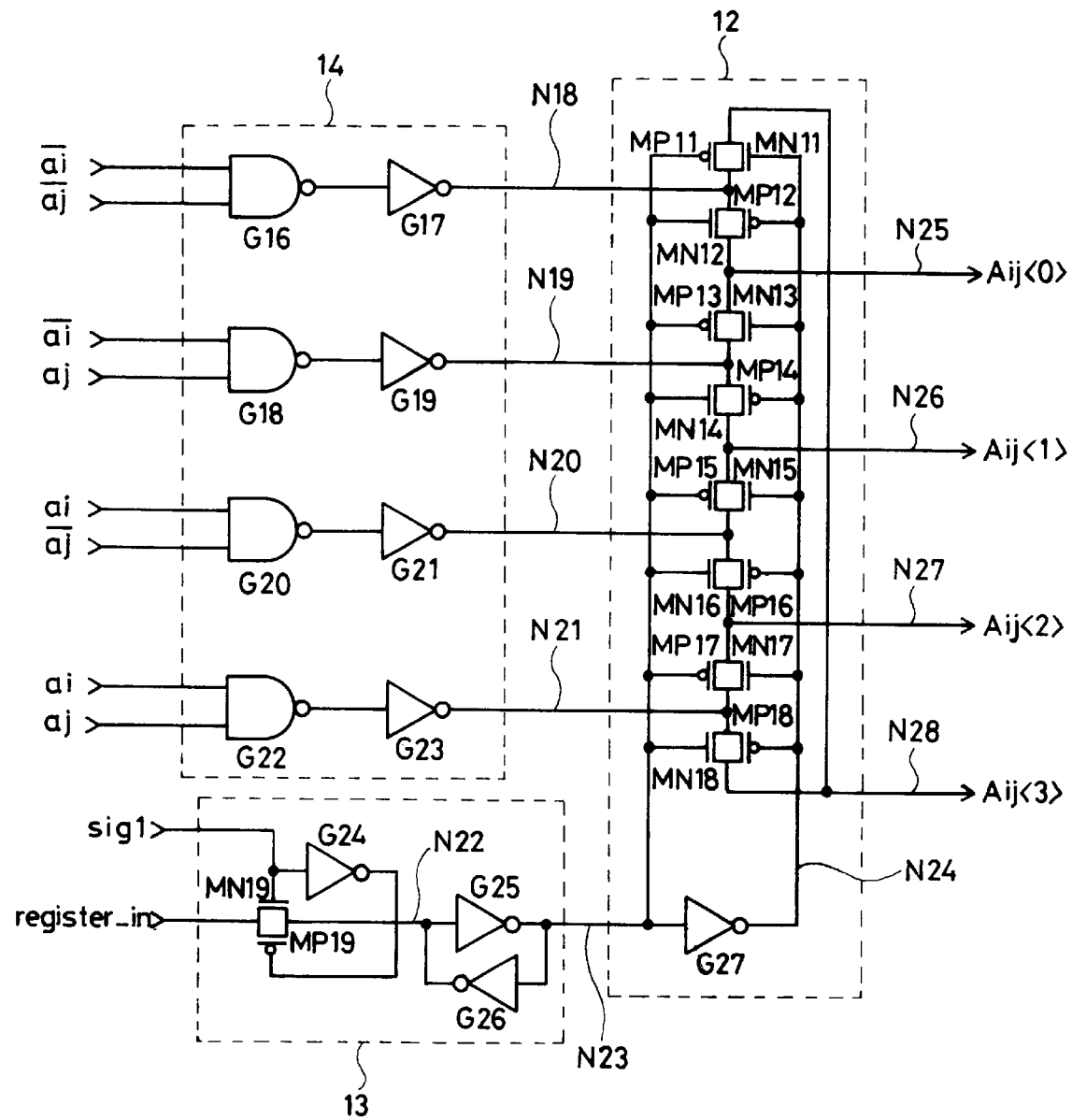
FIG. 7 is a circuit diagram of an address input buffer in accordance with a third embodiment of the present invention.

Referring to FIG. 7, there is shown a circuit diagram of an address input buffer in accordance with a third embodiment of the present invention. As shown in this drawing, the address input buffer comprises a predecoder 14 including a NAND gate G16 for NANDing external address signals /ai and /aj, an inverter G17 connected between an output terminal of the SAND gate G16 and a node N18, a NAND gate G18 for NANDing the external address signal /ai and an external address signal aj, an inverter G19 connected between an output terminal of the NAND gate G18 and a node N19, a NAND gate G20 for NANDing an external address signal ai and the external address signal /aj, an inverter G21 connected between an output terminal of the NAND gate G20 and a node N20, a NAND gate G22 for NANDing the external address signals ai and aj, and an inverter G23 connected between an output terminal of the NAND gate G22 and a node N21.

The address input buffer further comprises a multiplexing circuit control signal generator 13 including transfer transistors MN19 and MP19 for transferring an input signal register__in to a node N22 in response to a control signal sig1, an inverter G24 for inverting the control signal sig1 being applied to a gate of the transfer transistor MN19 and applying the inverted control signal to a gate of the transfer transistor MP19, and inverters G25 and G26 connected in parallel between the node N22 and a node N23.

The address input buffer further comprises a multiplexing circuit 12 including an inverter G27 connected between the node N23 and a node N24, transfer transistors MP11 and MN11 connected between the node N18 and a node N28, transfer transistors MP12 and MN12 connected between the node N18 and a node N25, transfer transistors MP13 and MN13 connected between the nodes N19 and N25, transfer transistors MP14 and MN14 connected between the node N19 and a node N26, transfer transistors MP15 and MN15 connected between the nodes N20 and N26, transfer transistors MP16 and MN16 connected between the node N20 and a node N27, transfer transistors MP17 and MN17 connected between the nodes N21 and N27, and transfer transistors MP18 and MN18 connected between the nodes N21 and N28. The transfer transistors MP11, MN12, MP13, MN14, MP15, MN16, MP17 and MN18 are operated in response to a signal on the node N23. The transfer transistors MN11, MP12, MN13, MP14, MN15, MP16, MN17 and MP18 are operated in response to a signal on the node N24.

The operation of the address input buffer with the above-mentioned construction in accordance with the third embodiment of the present invention will hereinafter be described in detail.

If the signal on the node N23 which is a control signal to the multiplexing circuit 12 is high in level, the transfer transistors MN12, MP12, MN14, MP14, MN16, MP16, MN18 and MP18 in the multiplexing circuit 12 are turned on. AS a result, signals on the nodes N18–N21 are outputted as internal address signals Aij(0), Aij(1), Aij(2) and Aij(3), respectively. On the contrary, if the signal on the node N23 is low in level, the transfer transistors MP11, MN11, MP13, MN13, MP15, MM18, MP17 and MN17 in the multiplexing circuit 12 are turned on. As a result, the signals on the nodes N18–N21 are outputted as the internal address signals Aij(3), Aij(0), Aij(1), and Aij (2). respectively.

Figure 8:
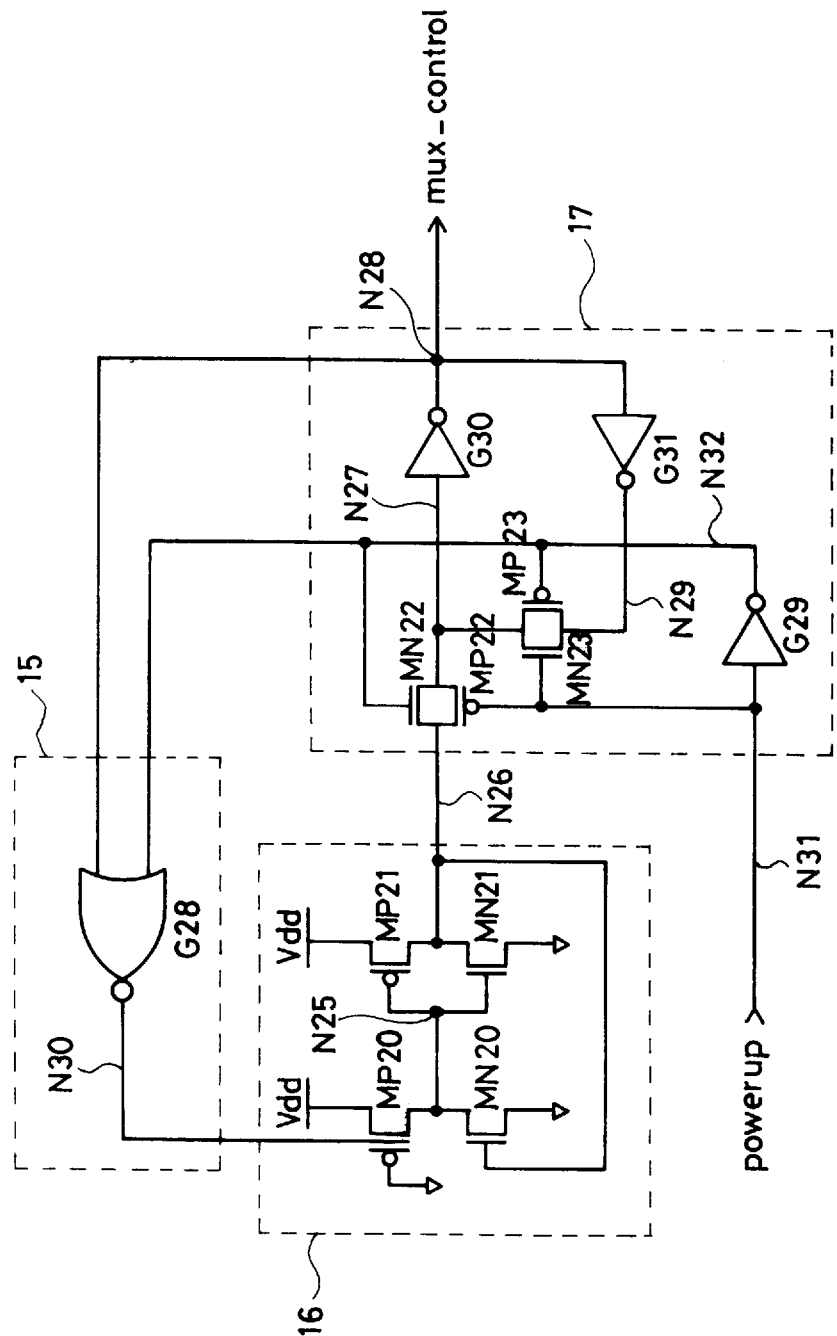
FIG. 8 is a circuit diagram of an alternative embodiment of a multiplexing circuit control signal generator in each of the address input buffers in FIGS. 5 to 7 in accordance with the present invention.

Referring to FIG. 8, there is shown a circuit diagram of an alternative embodiment of the multiplexing circuit control signal generator 13 in each of the address input buffers in FIGS. 5 to 7 in accordance with the present invention. As shown in this drawing, the multiplexing circuit control signal generator 13 includes a latch circuit 17 for generating the control signal to the multiplexing circuit 12 in response to a power-up signal, a program circuit 15 for determining its output signal in response to an operating state of the latch circuit 17, and an initialization circuit 16 for controlling an initialization operation in response to the output signal from the program circuit 15.

The latch circuit 17 includes an inverter G29 connected between a node N31 for inputting the power-up signal and a node N32, and transfer transistors MP22 and MN22 connected between nodes N26 and N27. The transfer transistor MP22 has a gate connected to the node N31. The transfer transistor MN22 has a gate connected to the node N32.

The latch circuit 17 further includes an inverter G30 connected between the node N27 and a node N28, an inverter G31 connected between the node N28 and a node N29, and transfer transistors MN23 and MP23 connected between the nodes N29 and N27. The transfer transistor MN23 has a gate connected to the node N31. The transfer transistor MP23 has a gate connected to the node N32.

The program circuit 15 includes a NOR gate G28 for NORing signals from the nodes N28 and N32 and outputting the NORed result to a node N30.

The initialization circuit 16 includes a PMOS transistor MP20 connected between a supply voltage source Vdd and a node N25. The PMOS transistor MP20 has a gate connected in common to the node N30 and a ground voltage source Vss.

The initialization circuit 16 further includes an NMOS transistor MN20 connected between the node N25 and the ground voltage source Vss. The MMOS transistor MN20 has a gate connected to the node N26.

The initialization circuit 16 further includes a PMOS transistor MP21 connected between the supply voltage source Vdd and the node N26, and an NMOS transistor MN21 connected between the node N26 and the ground voltage source Vss. The PMOS transistor MP21 has a gate connected to the node N25. The NMOS transistor MN21 has a gate connected to the node N25.

The operation of the multiplexing circuit control signal generator 13 with the above-mentioned construction in accordance with the alternative embodiment of the present invention will hereinafter be described in detail.

In the latch circuit 17, the transfer transistors MN22 and MP22 are turned on when the power-up signal is low in level. As being turned on, the transfer transistors MN22 and MP22 transfer a signal on the node N26 to the node N27. On the contrary, if the power-up signal is high in level, the transfer transistors MN23 and MP23 are turned on to transfer a signal on the node N29 to the node N27.

In the program circuit 18, the NOR gate G28 outputs a high level signal to the node N30 only when the signals on the nodes N28 and N32 are both low in level. The signal on the node N30 is applied to the gate of the PMOS transistor MP20 in the initialization circuit 16.

In the initialization circuit 16, the PMOS transistor MP20 is operated in response to the signal on the node N30 which is the output signal from the program circuit 15. The PMOS transistor MP20 is a programmable element which is turned off for production of the first internal address and then turned on for the subsequent operation. In other words, the AMOS transistor MP20 is turned on for the power-up operation and then turned off for the subsequent operation. The signal on the node N28 is varied in level according to the operating state of the PMOS transistor MP20.

As apparent from the above description, according to the present invention, the address input buffer for the semiconductor memory device can convert the external address signals in such a manner that the memory cells in the memory device can fairly be accessed. Therefore, the life of the memory device can be lengthened.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An address input buffer for a semiconductor memory device which is capable of converting address signals from external pins to access memory cells uniformly comprises of:

address buffering means buffering at least two external address signals;

multiplexing means receiving the external address signals buffered by said address buffering means and outputting the external address signals as the corresponding internal address signals through the output terminals thereof; and multiplexing control means selectively transferring the external address signals buffered by said address buffering means to said output terminals, wherein significant bits sequence order of the internal address signals outputted from the output terminals of the multiplexing means is proportional to significant bits sequence order of the external address signals or reciprocal to significant bits sequence order of the external address signals in accordance with an output signal state of the multiplexing control means.

2. An address input buffer for a semiconductor memory device as set forth in claim 1, wherein said multiplexing means transfers an external address signal Ai as an internal row address row address_i and an internal column address col add_i in the first case and as an internal row address row address_j and an internal column address col add_k in the second case, where i, j, k, . . . =1, 2, 3, . . .

3. An address input buffer for a semiconductor memory device which is capable of converting address signals from external pins to access memory cells uniformly comprises of:

address buffering means buffering at least two external address signals;

multiplexing means receiving the external address signals buffered by said address buffering means and outputting the external address signals as the corresponding internal address signals through the output terminals thereof; and multiplexing control means selectively transferring the external address signals buffered by said address buffering means to said output terminals, wherein significant bits sequence order of the internal address signals outputted from the output terminals of the multiplexing means is proportional to significant bits sequence order of the external address signals or reciprocal to significant bits sequence order of the external address signals in accordance with an output signal state of the multiplexing control means, and wherein said multiplexing means produces the internal address signals corresponding respectively to the external address signals in the first case and those in the second case by inverting the external address signals.

4. An address input buffer for a semiconductor memory device as set forth in claim 1, wherein said multiplexing means is used in an internal address circuitry.

5. An address input buffer for a semiconductor memory device as set forth in claim 1, wherein said address buffering means includes at least two inverter circuits for buffering the external address signals, respectively, each of said inverter circuits having two inverters connected in series.

6. An address input buffer for a semiconductor memory device as set forth in claim 1, wherein said address buffering means includes:

first and second inverters connected in series, for buffering an external address signal; and a third inverter connected to an output terminal of said second inverter for inverting an output from said second inverter.

7. An address input buffer for a semiconductor memory device as set forth in claim 1, wherein said multiplexing control means includes a programmable mode register for enabling an external address conversion program.

8. An address input buffer for a semiconductor memory device comprising:

address buffering means for buffering at least two external address signals A1 and A2;

at least two output terminals for outputting the external address signals A1 and A2 buffered by said address buffering means as internal address signals AI_1 and AI_2, respectively;

multiplexing means electrically connected between said address buffering means and said output terminals, for selectively transferring the external address signals A1 and A2 buffered by said address buffering means to said output terminals; and multiplexing control means for controlling said multiplexing means wherein said multiplexing control means includes means for storing a status before a power signal is turned on, to produce an internal address signal in response to a true address for an operation before the power signal is turned on and in response to a complementary address for the subsequent operation.

* * * * *